(12) United States Patent
Omote et al.

(10) Patent No.: US 8,410,869 B2
(45) Date of Patent: Apr. 2, 2013

(54) ELASTIC-WAVE FILTER DEVICE HAVING A BAND-PASS FILTER AND A BAND-REJECT FILTER

(75) Inventors: Katsuhito Omote, Nagaokakyo (JP); Yoshihiro Iwasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/589,202

(22) Filed: Aug. 20, 2012

(65) Prior Publication Data

US 2012/0306595 A1     Dec. 6, 2012

Related U.S. Application Data

(63) Continuation of application No. PCT/JP2011/050027, filed on Jan. 5, 2011.

(30) Foreign Application Priority Data

Mar. 1, 2010   (JP) ................................ 2010-044566

(51) Int. Cl.
*H03H 9/54*     (2006.01)
*H03H 9/64*     (2006.01)

(52) U.S. Cl. ..... 333/193; 333/189; 333/195; 310/313 B; 310/322

(58) Field of Classification Search ................... 333/133, 333/189, 191–196; 310/313 B, 313 D, 320–322
See application file for complete search history.

(56) References Cited

U.S. PATENT DOCUMENTS

| 7,626,475 | B2* | 12/2009 | Taniguchi | 333/195 |
|---|---|---|---|---|
| 7,777,597 | B2* | 8/2010 | Beaudin et al. | 333/189 |
| 2005/0099244 | A1 | 5/2005 | Nakamura et al. | |
| 2009/0256649 | A1 | 10/2009 | Taniguchi | |
| 2011/0090026 | A1* | 4/2011 | Nakahashi et al. | 333/195 |
| 2011/0210805 | A1* | 9/2011 | Link et al. | 333/134 |

FOREIGN PATENT DOCUMENTS

| JP | 8-65097 | * | 3/1996 |
|---|---|---|---|
| JP | 11-205064 | * | 7/1999 |
| JP | 2004-129238 A | | 4/2004 |
| WO | 2007/015331 A1 | | 2/2007 |
| WO | 2008/072439 A1 | | 6/2008 |
| WO | 2009/099248 A1 | | 8/2009 |

OTHER PUBLICATIONS

Jian et al.; "SAW Band Reject Filter Performance at 850 MHz"; 2005 IEEE Ultrasonics Symposium, pp. 2162-2165, Sep. 18-21, 2005.*
Official Communication issued in International Patent Application No. PCT/JP2011/050027, mailed on Mar. 22, 2011.

* cited by examiner

*Primary Examiner* — Barbara Summons
(74) *Attorney, Agent, or Firm* — Keating & Bennett, LLP

(57) ABSTRACT

In an elastic-wave filter device that includes a band-pass filter and a band-eliminate filter connected to the band-pass filter, insertion loss in a pass band is significantly reduced and attenuation in a stop band is significantly increased. The elastic-wave filter device has a pass band and a stop band at frequencies higher than the pass band. The band-pass filter and the first band-eliminate filter are connected in series between an input terminal and an output terminal. A first parallel-arm resonator of the first band-eliminate filter includes a first resonance frequency in the stop band. A second parallel-arm resonator includes a second resonance frequency in the stop band, the second resonance frequency being higher than the first resonance frequency. An impedance value of the first parallel-arm resonator is larger than an impedance value of the second parallel-arm resonator.

7 Claims, 11 Drawing Sheets

ELASTIC-WAVE FILTER DEVICE HAVING A BAND-PASS FILTER AND A BAND-REJECT FILTER

BACKGROUND OF THE INVENTION

1. Field of the Invention

The present invention relates to elastic-wave filter devices. In particular, the present invention relates to an elastic-wave filter device that includes a band-pass filter and a band-eliminate filter connected to the band-pass filter.

2. Description of the Related Art

Conventionally, elastic-wave filter devices have been used as filter devices mounted on RF circuits for communication equipment, such as mobile phones. An elastic-wave filter device is a filter device that uses elastic waves, such as surface acoustic waves, boundary acoustic waves, and bulk waves. Examples of the elastic-wave filter device include an elastic-wave band-pass filter device capable of passing signals in a certain frequency band, and an elastic-wave band-eliminate filter device capable of rejecting signals in a certain frequency band.

For example, Japanese Unexamined Patent Application Publication No. 2004-129238 discloses an elastic-wave filter device that includes a ladder elastic-wave band-eliminate filter composed of a plurality of parallel-arm elastic wave resonators and at least one series inductor. Japanese Unexamined Patent Application Publication No. 2004-129238 describes a technique in which a stop band is widened by making resonance frequencies of the plurality of parallel-arm elastic wave resonators different from each other in the elastic-wave band-eliminate filter.

Japanese Unexamined Patent Application Publication No. 2004-129238 also describes a technique in which the elastic-wave band-eliminate filter is combined with another elastic wave filter. For example, the elastic-wave band-eliminate filter may be combined with an elastic-wave band-pass filter. FIG. 15 illustrates an example of an elastic-wave filter device that includes an elastic-wave band-eliminate filter and an elastic-wave band-pass filter.

As illustrated in FIG. 15, an elastic-wave filter device 100 includes an elastic-wave band-pass filter 110 and an elastic-wave band-eliminate filter 120. The elastic-wave band-pass filter 110 and the elastic-wave band-eliminate filter 120 are connected in series between an input terminal 101 and an output terminal 102. The elastic-wave filter device 100 has a pass band and a stop band at frequencies higher than the pass band. The pass band is formed mainly by the elastic-wave band-pass filter 110. The stop band is formed mainly by the elastic-wave band-eliminate filter 120. With this configuration, it is possible to increase out-of-band attenuation at frequencies higher than the pass band. As illustrated in FIG. 15, the elastic-wave band-eliminate filter 120 is a ladder filter that includes a first parallel-arm elastic wave resonator P101, a series inductor L100, and a second parallel-arm elastic wave resonator P102.

As described in Japanese Unexamined Patent Application Publication No. 2004-129238, by making a resonance frequency f101 of the first parallel-arm elastic wave resonator P101 different from a resonance frequency f102 of the second parallel-arm elastic wave resonator P102, it is possible to widen the stop band at frequencies higher than the pass band. However, in the elastic-wave filter device 100, it may be difficult to achieve sufficiently large attenuation in the stop band at frequencies higher than the pass band.

As a way to increase attenuation in the stop band, it may be possible to reduce impedances of the first and second parallel-arm elastic wave resonators P101 and P102 included in the elastic-wave band-eliminate filter 120. This is because reducing the impedances of the first and second parallel-arm elastic wave resonators P101 and P102 makes signals flow easily through parallel arms to a ground potential.

However, reducing the impedances of the first and second parallel-arm elastic wave resonators P101 and P102 may increase insertion loss at higher frequencies in the pass band.

SUMMARY OF THE INVENTION

In view of the above, preferred embodiments of the present invention provide an elastic-wave filter device including a band-pass filter and a band-eliminate filter connected to the band-pass filter that significantly reduces insertion loss in a pass band and significantly increases attenuation in a stop band.

A first elastic-wave filter device according to a preferred embodiment of the present invention is an elastic-wave filter device that has a pass band and a stop band at frequencies higher than the pass band and includes an input terminal, an output terminal, a band-pass filter, and a first band-eliminate filter. The band-pass filter is connected in series between the input terminal and the output terminal. The first band-eliminate filter is connected in series between the input terminal and the output terminal. The first band-eliminate filter includes a series arm, at least one inductor, a plurality of parallel arms, and a plurality of parallel-arm resonators in the respective plurality of parallel arms. The series arm is connected in series between the input terminal and the output terminal. The at least one inductor is connected in series in the series arm. The plurality of parallel arms are connected between the series arm and a ground potential. The plurality of parallel-arm resonators include a first parallel-arm resonator and a second parallel-arm resonator. The first parallel-arm resonator has a first resonance frequency in the stop band. The second parallel-arm resonator has a second resonance frequency in the stop band, the second resonance frequency being higher than the first resonance frequency. An impedance value of the first parallel-arm resonator is larger than an impedance value of the second parallel-arm resonator.

A second elastic-wave filter device according to a preferred embodiment of the present invention is an elastic-wave filter device that has a pass band and a stop band at frequencies lower than the pass band and includes an input terminal, an output terminal, a band-pass filter, and a first band-eliminate filter. The band-pass filter is connected in series between the input terminal and the output terminal. The first band-eliminate filter is connected in series between the input terminal and the output terminal. The first band-eliminate filter includes a series arm, at least one inductor, a plurality of parallel arms, and a plurality of parallel-arm resonators in the respective plurality of parallel arms. The series arm is connected in series between the input terminal and the output terminal. The at least one inductor is connected in series in the series arm. The plurality of parallel arms are connected between the series arm and a ground potential. The plurality of parallel-arm resonators include a first parallel-arm resonator and a second parallel-arm resonator. The first parallel-arm resonator has a first resonance frequency in the stop band. The second parallel-arm resonator has a second resonance frequency in the stop band, the second resonance frequency being higher than the first resonance frequency. An impedance value of the second parallel-arm resonator is larger than an impedance value of the first parallel-arm resonator.

In a specific aspect of the first or second elastic-wave filter device according to a preferred embodiment of the present invention, the first band-eliminate filter further includes a first ground electrode and a second ground electrode. The parallel arm including the first parallel-arm resonator is connected to the first ground electrode. The first ground electrode is connected to the ground potential. The parallel arm including the second parallel-arm resonator is connected to the second ground electrode. The second ground electrode is connected to the ground potential. The first ground electrode and the second ground electrode are separated from each other. This configuration can significantly increase attenuation in the stop band.

In another specific aspect of the first or second elastic-wave filter device according to a preferred embodiment of the present invention, the elastic-wave filter device further includes a second band-eliminate filter. The second band-eliminate filter is connected in series between the input terminal and the output terminal. The second band-eliminate filter includes a series arm, at least one inductor, a plurality of parallel arms, and a plurality of parallel-arm resonators in the respective plurality of parallel arms. The series arm is connected in series between the input terminal and the output terminal. The at least one inductor is connected in series in the series arm. The plurality of parallel arms are connected between the series arm and the ground potential. This configuration significantly increases attenuation in the stop band at frequencies higher than the pass band.

In a different specific aspect of the first or second elastic-wave filter device according to a preferred embodiment of the present invention, between the input terminal and the output terminal, the first band-eliminate filter is connected in series to one end of the band-pass filter, and the second band-eliminate filter is connected in series to the other end of the band-pass filter. This configuration significantly reduces the size of the elastic-wave filter device.

In still another specific aspect of the first or second elastic-wave filter device according to a preferred embodiment of the present invention, the plurality of parallel-arm resonators of the first band-eliminate filter and the plurality of parallel-arm resonators of the second band-eliminate filter have different resonance frequencies. This configuration significantly widens the bandwidth of the stop band at frequencies higher than the pass band.

In a still different specific aspect of the first or second elastic-wave filter device according to a preferred embodiment of the present invention, of the plurality of parallel-arm resonators of the first band-eliminate filter and the plurality of parallel-arm resonators of the second band-eliminate filter, two or more parallel-arm resonators have the same resonance frequency. This configuration significantly increases attenuation in the stop band at frequencies higher than the pass band.

In the first elastic-wave filter device according to a preferred embodiment of the present invention, the impedance value of the first parallel-arm resonator having a lower resonance frequency closer to the pass band is larger than the impedance value of the second parallel-arm resonator having a higher resonance frequency farther from the pass band. This makes signals flow less easily through the parallel arm having the first parallel-arm resonator to the ground potential, and makes signals flow easily through the parallel arm having the second parallel-arm resonator to the ground potential. Therefore, it is possible to significantly reduce insertion loss at higher frequencies in the pass band and significantly increase attenuation in the stop band.

In the second elastic-wave filter device according to a preferred embodiment of the present invention, the impedance value of the second parallel-arm resonator having a higher resonance frequency closer to the pass band is larger than the impedance value of the second parallel-arm resonator having a lower resonance frequency farther from the pass band. This makes signals flow less easily through the parallel arm having the second parallel-arm resonator to the ground potential, and makes signals flow easily through the parallel arm having the first parallel-arm resonator to the ground potential. Therefore, it is possible to significantly reduce insertion loss at lower frequencies in the pass band and significantly increase attenuation in the stop band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A preferred embodiment of the present invention will now be described using an elastic-wave filter device 1 of FIG. 1 as an example. Note, however, that the elastic-wave filter device 1 is merely a non-limiting example. The elastic-wave filter device according to the present invention is not limited to the elastic-wave filter device 1.

Figure 1:
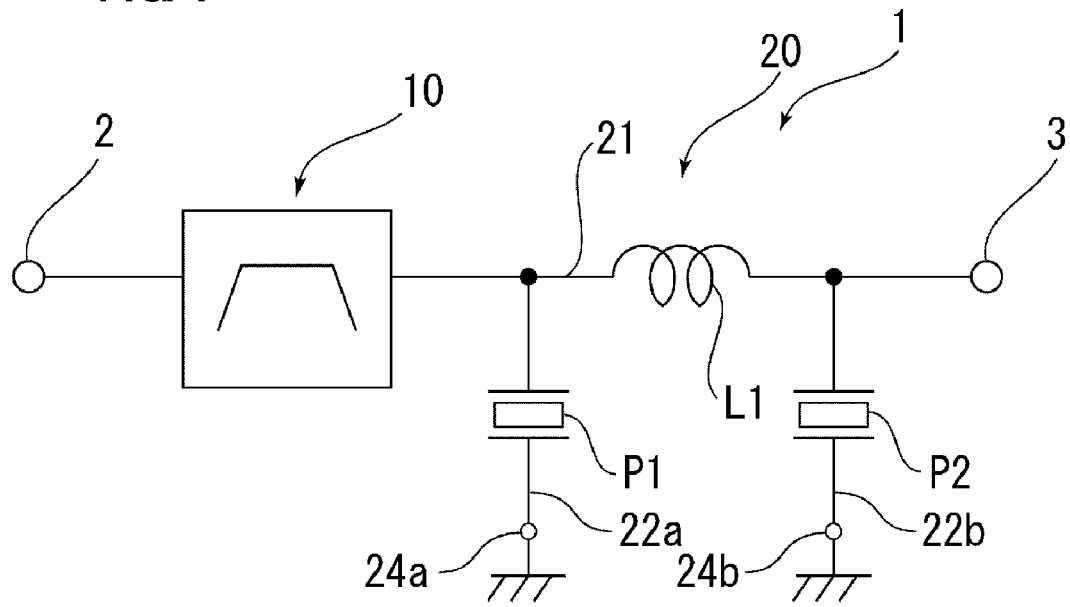
FIG. 1 is an equivalent circuit diagram of an elastic-wave filter device according to a first preferred embodiment of the present invention.
Figure 2:
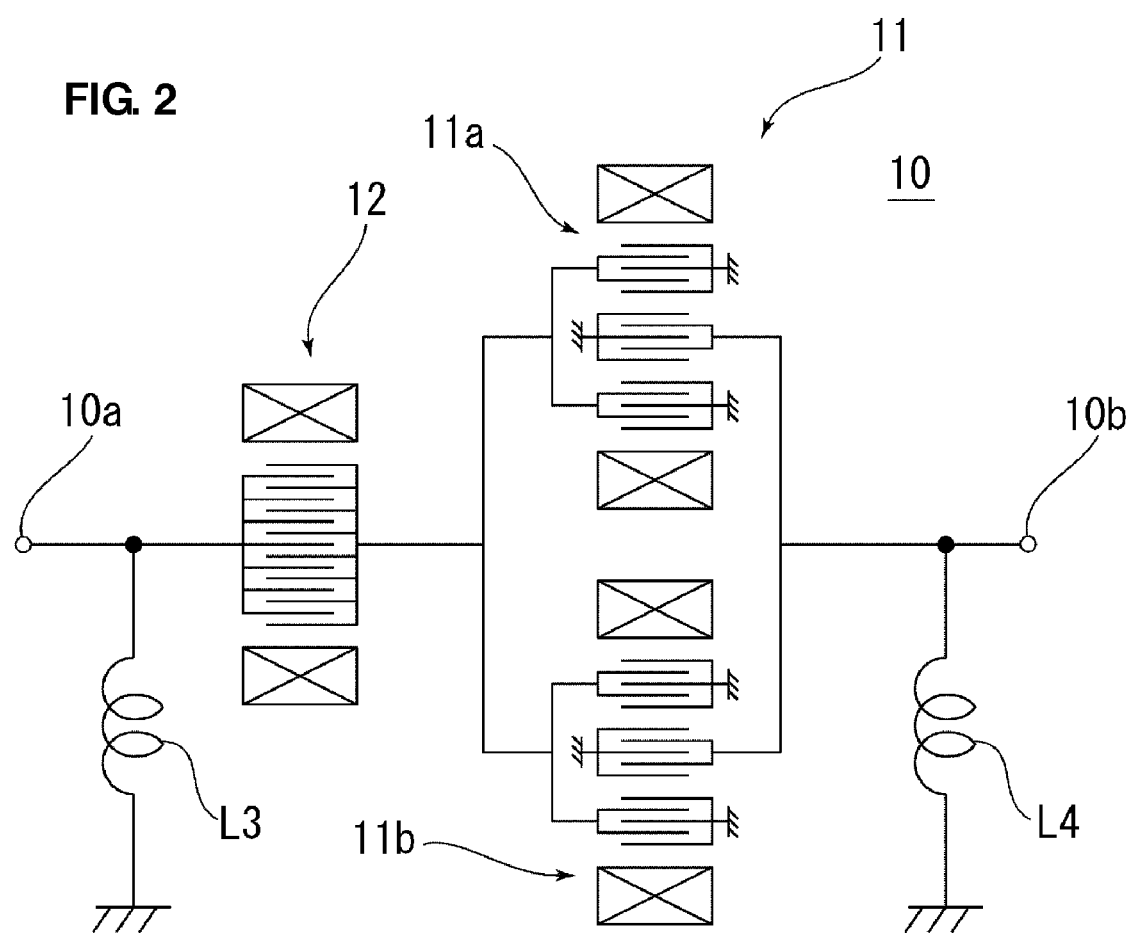
FIG. 2 is an equivalent circuit diagram of a band-pass filter in the elastic-wave filter device according to the first preferred embodiment of the present invention.
Figure 3:
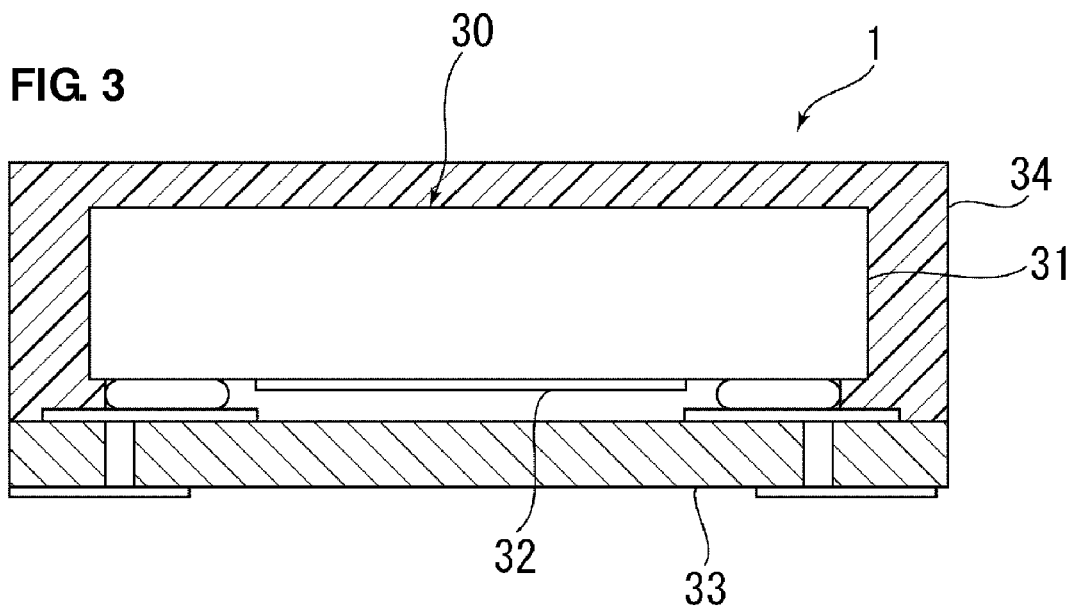
FIG. 3 is a schematic cross-sectional view of the elastic-wave filter device according to the first preferred embodiment of the present invention.

FIG. 1 is an equivalent circuit diagram of the elastic-wave filter device 1 according to the first preferred embodiment of the present invention. FIG. 2 is an equivalent circuit diagram of a band-pass filter 10 in the elastic-wave filter device 1 according to the first preferred embodiment of the present invention. FIG. 3 is a schematic cross-sectional view of the elastic-wave filter device 1 according to the first preferred embodiment of the present invention.

As illustrated in FIG. 1, the elastic-wave filter device 1 includes an input terminal 2 and an output terminal 3. The band-pass filter 10 and a first band-eliminate filter 20 are connected in series between the input terminal 2 and the output terminal 3. In the present preferred embodiment, the band-pass filter 10 is disposed closer to the input terminal 2 than the first band-eliminate filter 20 is to the input terminal 2. However, the band-pass filter 10 may be disposed closer to the output terminal 3 than the first band-eliminate filter 20 is to the output terminal 3.

The elastic-wave filter device 1 has a pass band and a stop band at frequencies higher than the pass band. Specifically, in the present preferred embodiment, the stop band preferably ranges from 2.50 GHz to 2.57 GHz, and the pass band ranges from 2.40 GHz to 2.48 GHz, for example. The pass band is defined mainly by the band-pass filter 10. The stop band is defined mainly by the first band-eliminate filter 20.

As illustrated in FIG. 2, the band-pass filter 10 includes a terminal 10a connected to the input terminal 2 and a terminal 10b connected through the first band-eliminate filter 20 to the output terminal 3. A longitudinally coupled resonator-type surface acoustic wave filter 11 is connected between the terminal 10a and the terminal 10b. The longitudinally coupled resonator-type surface acoustic wave filter 11 includes two three-IDT-type longitudinally coupled resonator-type surface acoustic wave filter elements 11a and 11b connected in parallel. A one-port-type surface acoustic wave resonator 12 is connected between the terminal 10a and the longitudinally coupled resonator-type surface acoustic wave filter 11. A matching inductor L3 is connected between a connection point between the one-port-type surface acoustic wave resonator 12 and the terminal 10a and the ground potential. A matching inductor L4 is connected between a connection point between the longitudinally coupled resonator-type surface acoustic wave filter 11 and the terminal 10b and the ground potential.

In various preferred embodiments of the present invention, the band-pass filter is not limited to a specific one, as long as it is capable of defining a pass band. The band-pass filter may be a filter having a configuration different from that illustrated in FIG. 2. For example, the band-pass filter may be a ladder filter.

As illustrated in FIG. 1, the first band-eliminate filter 20 preferably is a ladder filter. The first band-eliminate filter 20 includes a series arm 21 connected in series between the input terminal 2 and the output terminal 3. Specifically, the series arm 21 is connected between the terminal 10b illustrated in FIG. 2 and the output terminal 3.

The series arm 21 includes at least one inductor L1. Specifically, the series arm 21 includes one inductor L1 in the present preferred embodiment. Alternatively, the series arm 21 may include a plurality of inductors. In this case, the plurality of inductors are connected in series in the series arm 21. In the present preferred embodiment, an inductance value of the inductor L1 preferably is about 3 nH, for example.

A plurality of parallel arms 22a and 22b are connected between the series arm 21 and the ground potential. Specifically, in the present preferred embodiment, two parallel arms 22a and 22b are connected between the series arm 21 and the ground potential. The parallel arm 22a is connected between a connection point between the band-pass filter 10 and the inductor L1 and the ground potential. The parallel arm 22b is connected between a connection point between the inductor L1 and the output terminal 3 and the ground potential. The parallel arm 22a includes a first parallel-arm resonator P1. The parallel arm 22b includes a second parallel-arm resonator P2. The parallel arm 22a includes a ground electrode 24a connected to the ground potential. The parallel arm 22b includes a ground electrode 24b connected to the ground potential. In the present preferred embodiment, the parallel arms 22a and 22b preferably are individually connected to the ground potential by the ground electrodes 24a and 24b, respectively. In other words, in the present preferred embodiment, the first and second parallel-arm resonators P1 and P2 preferably are individually connected to the ground potential by the ground electrodes 24a and 24b, respectively. The ground electrodes 24a and 24b may be provided as a single electrode which allows the parallel arms 22a and 22b to be connected together to the ground potential. It is preferable, however, that the parallel arms 22a and 22b be connected individually to the ground potential. If the parallel arms 22a and 22b are connected individually to the ground potential, or in other words, if the first and second parallel-arm resonators P1 and P2 are connected individually to the ground potential, it is possible to significantly increase attenuation in the stop band.

In the present preferred embodiment, the first parallel-arm resonator P1 and the second parallel-arm resonator P2 preferably are elastic wave resonators. Specifically, the first parallel-arm resonator P1 and the second parallel-arm resonator P2 preferably are surface acoustic wave resonators. Typically, a surface acoustic wave resonator preferably includes a piezoelectric substrate, an IDT electrode located on the piezoelectric substrate and including a pair of comb-shaped electrodes interdigitating with each other, and reflectors disposed on both sides of a region where there is the IDT electrode in a surface acoustic wave propagating direction.

However, the first and second parallel-arm resonators P1 and P2 do not have to be surface acoustic wave resonators. The first and second parallel-arm resonators P1 and P2 may be boundary acoustic wave resonators or bulk wave resonators, for example.

The first parallel-arm resonator P1 has a resonance frequency f1. The second parallel-arm resonator P2 has a resonance frequency f2. The resonance frequency f1 of the first parallel-arm resonator P1 and the resonance frequency f2 of the second parallel-arm resonator P2 are in the stop band. The resonance frequency f2 of the second parallel-arm resonator P2 is higher than the resonance frequency f1 of the first parallel-arm resonator P1. Specifically, in the present preferred embodiment, the resonance frequency f1 of the first parallel-arm resonator P1 preferably is 2.5 GHz, and the resonance frequency f2 of the second parallel-arm resonator P2 preferably is 2.507 GHz, for example.

An impedance value of the first parallel-arm resonator P1 is denoted by z1, and an impedance value of the second parallel-arm resonator P2 is denoted by z2. The impedance value z1 of the first parallel-arm resonator P1 is larger than the impedance value z2 of the second parallel-arm resonator P2. That is, the impedance value z1 of the first parallel-arm resonator P1 having a lower resonance frequency is larger than the impedance value z2 of the second parallel-arm resonator P2 having a higher resonance frequency.

A specific configuration of the elastic-wave filter device 1 according to the present preferred embodiment will be described with reference mainly to FIG. 3. As illustrated in FIG. 3, the elastic-wave filter device 1 includes an elastic-wave filter chip 30. The elastic-wave filter chip 30 includes a piezoelectric substrate 31 and an electrode structure 32 on the piezoelectric substrate 31. The electrode structure 32 defines the longitudinally coupled resonator-type surface acoustic wave filter 11 and the one-port-type surface acoustic wave resonator of the band-pass filter 10, and the first and second parallel-arm resonators P1 and P2 of the first band-eliminate filter 20. That is, in the present preferred embodiment, the longitudinally coupled resonator-type surface acoustic wave filter 11 and the one-port-type surface acoustic wave resonator 12 of the band-pass filter 10 and the first and second parallel-arm resonators P1 and P2 of the first band-eliminate filter 20 are located on the same piezoelectric substrate. The elastic-wave filter chip 30 is flip-chip-bonded to a mount board 33. The elastic-wave filter chip 30 is encapsulated in an encapsulation resin 34 on the mount board 33. The inductor L1 and the matching inductors L3 and L4 are defined by a wire on the piezoelectric substrate 31, a wire on the mount board 33, or a chip inductor. If any of the inductor L1 and the matching inductors L3 and L4 is defined by a chip inductor, the chip inductor is mounted either on the mount board 33 or on a circuit board on which the mount board 33 is mounted. The ground electrodes 24a and 24b are on the mount board 33.

As described above, in the present preferred embodiment, the impedance value z1 of the first parallel-arm resonator P1 having a lower resonance frequency is larger than the impedance value z2 of the second parallel-arm resonator P2 having a higher resonance frequency. In other words, the first parallel-arm resonator P1 and the second parallel-arm resonator P2 are configured to satisfy the relationships f1<f2 and z1>z2. That is, the impedance value z1 of the first parallel-arm resonator P1 having a resonance frequency closer to the pass band is larger than the impedance value z2 of the second parallel-arm resonator P2 having a resonance frequency farther from the pass band. In the present preferred embodiment, where the resonance frequency f1 of the first parallel-arm resonator P1 is different from the resonance frequency f2 of the second parallel-arm resonator P2, it is possible to widen the stop band.

Since the impedance value z1 of the first parallel-arm resonator P1 having a resonance frequency closer to the pass band is large, signals flow less easily to the ground potential through the parallel arm 22a having the first parallel-arm resonator P1. That is, signals around the resonance frequency f1 of the first parallel-arm resonator P1, the resonance frequency f1 being closer to the pass band, flow less easily to the ground potential. Therefore, it is possible to significantly reduce insertion loss at higher frequencies in the pass band.

Meanwhile, since the impedance value z2 of the second parallel-arm resonator P2 having a resonance frequency farther from the pass band is small, signals flow easily to the ground potential through the parallel arm 22b having the second parallel-arm resonator P2. That is, signals around the resonance frequency f2 of the second parallel-arm resonator P2 flow easily to the ground potential. Therefore, it is possible to significantly increase attenuation in the stop band.

In the present specification, the term "higher frequencies in the pass band" refers to frequencies in a higher frequency range within the pass band. The term "frequencies higher than the pass band" refers to frequencies in a frequency range higher than but close to the pass band.

The above-described advantages will now be described in detail on the basis of preferred embodiments and comparative examples.

The elastic-wave filter device 1 of the first preferred embodiment was prepared as Preferred Embodiment 1. An elastic-wave filter device was prepared as Comparative Example 1, the elastic-wave filter device having the same configuration as that of the elastic-wave filter device 1 of Preferred Embodiment 1 except that the impedance value z1 of the first parallel-arm resonator P1 and the impedance value z2 of the second parallel-arm resonator P2 have the relationship z1<z2. Another elastic-wave filter device was prepared as Comparative Example 2, the elastic-wave filter device having the same configuration as that of the elastic-wave filter device 1 of Preferred Embodiment 1 except that the impedance value z1 of the first parallel-arm resonator P1 and the impedance value z2 of the second parallel-arm resonator P2 have the relationship z1=z2. In the elastic-wave filter device of Comparative Example 2, the impedance value z1 of the first parallel-arm resonator P1 is equal to that in the elastic-wave filter device 1 of Preferred Embodiment 1, whereas the impedance value z2 of the second parallel-arm resonator P2 is larger than that in the elastic-wave filter device 1 of Preferred Embodiment 1, so that the impedance value z1 of the first parallel-arm resonator P1 and the impedance value z2 of the second parallel-arm resonator P2 have the relationship z1=z2.

Figure 4:
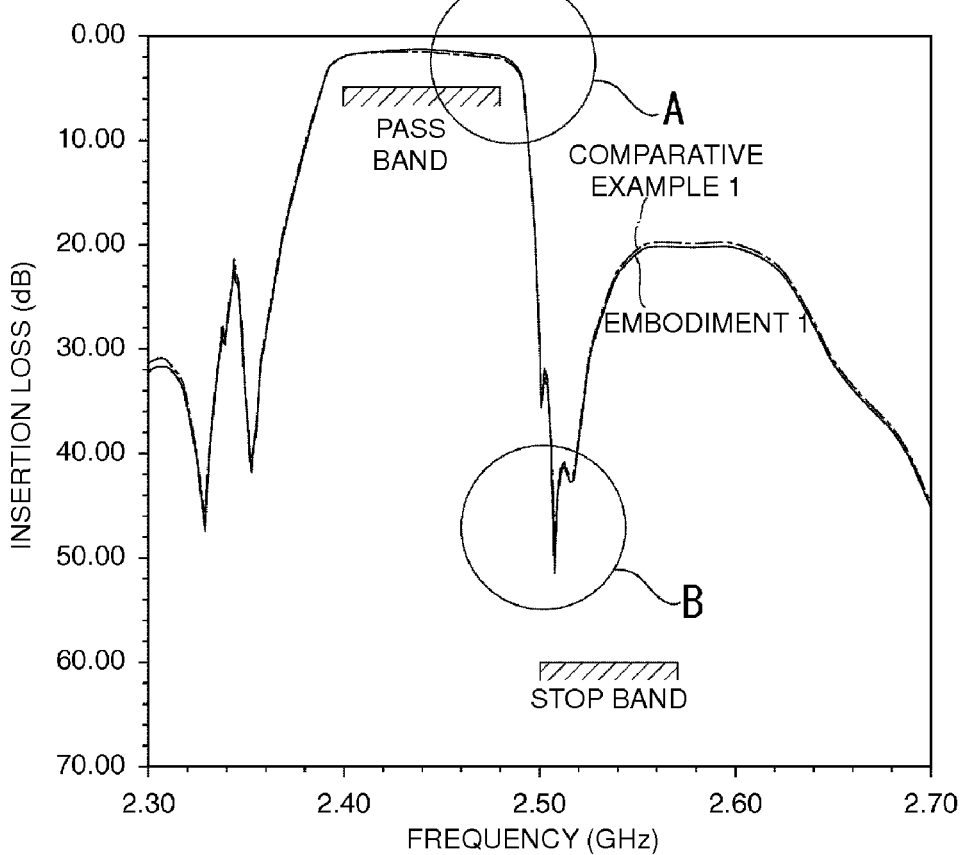
FIG. 4 is a graph showing a frequency characteristic of an elastic-wave filter device according to the first preferred embodiment and a frequency characteristic of an elastic-wave filter device according to Comparative Example 1.
Figure 5:
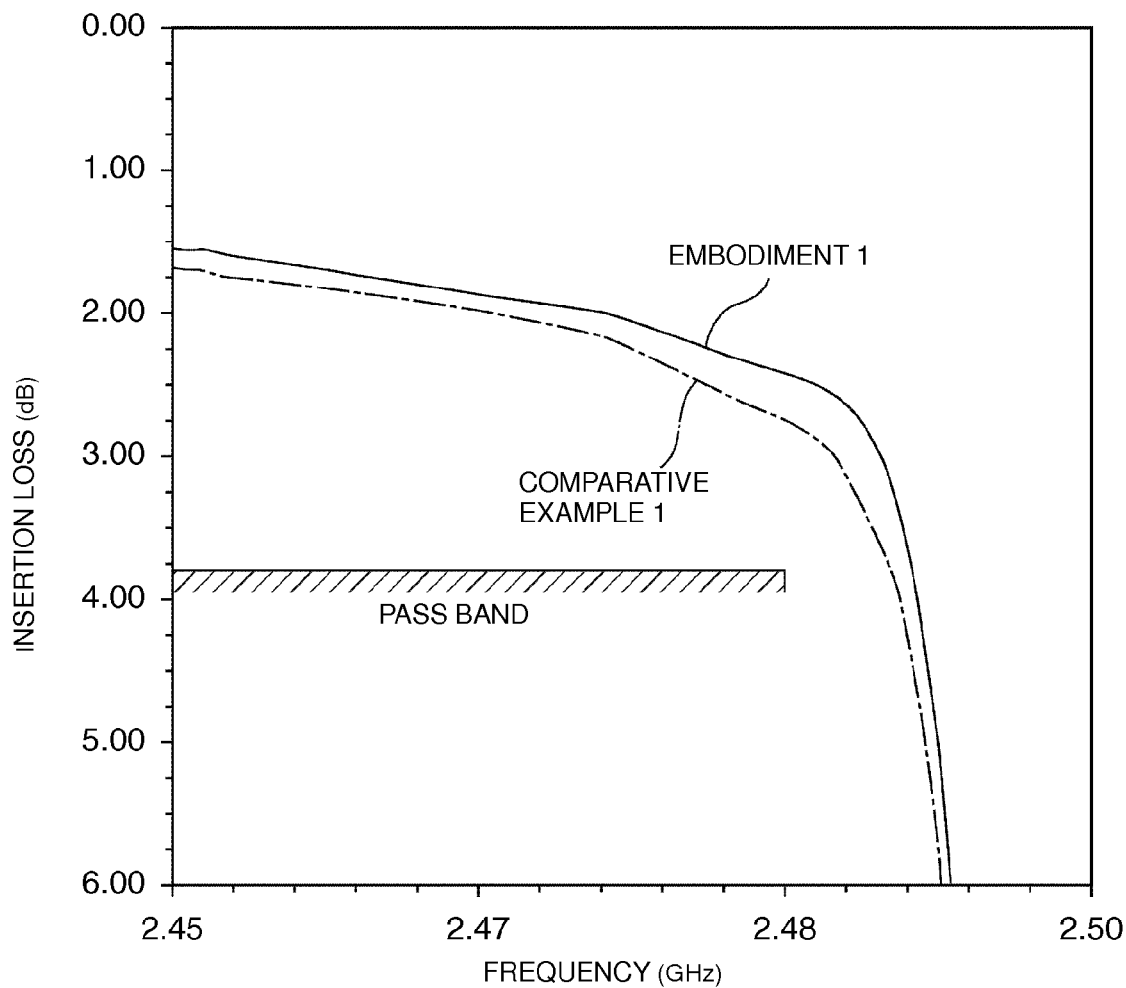
FIG. 5 is a graph showing an enlarged view of region A in FIG. 4.
Figure 6:
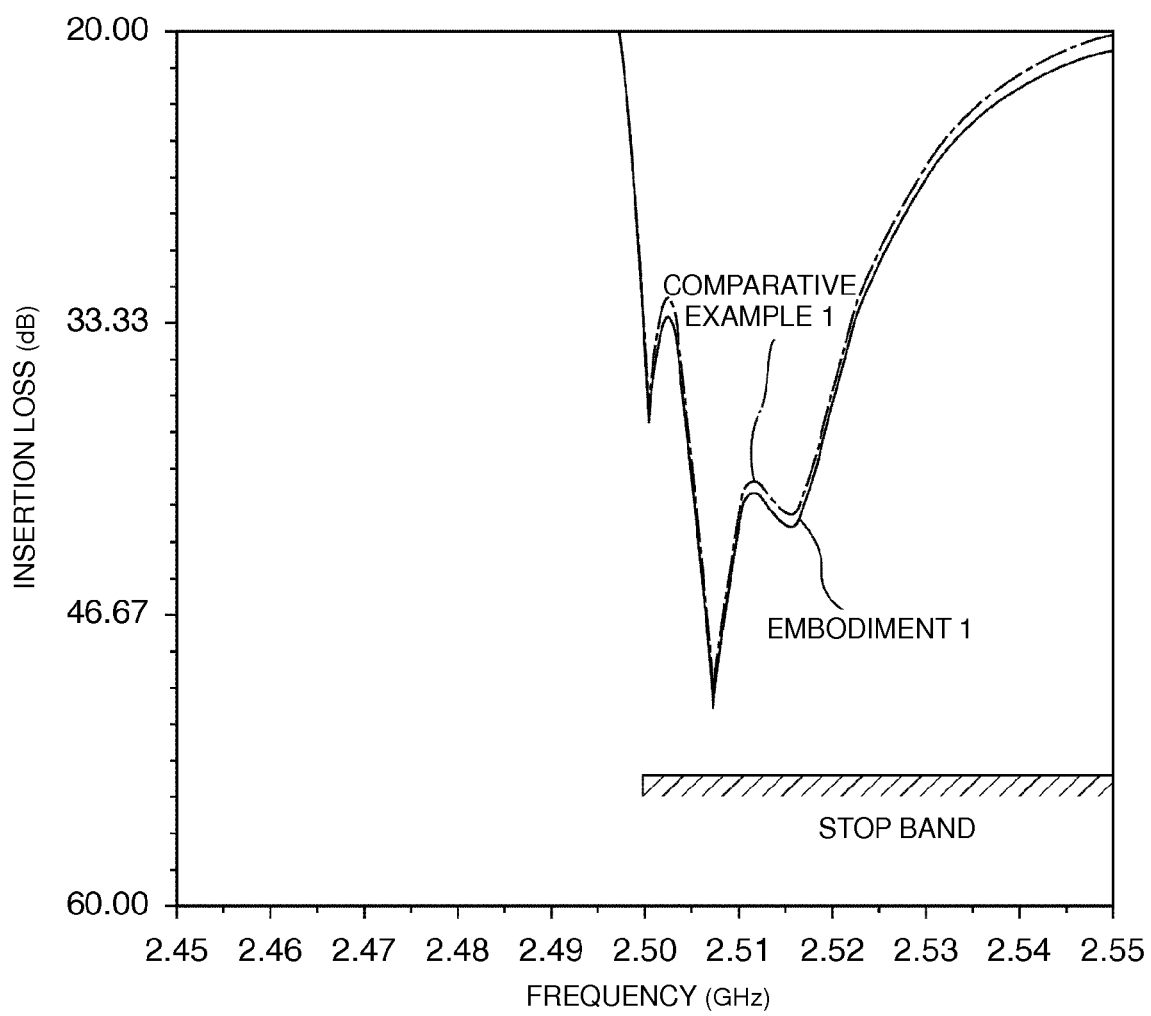
FIG. 6 is a graph showing an enlarged view of region B in FIG. 4.

FIG. 4 to FIG. 6 show a frequency characteristic of the elastic-wave filter device 1 of Preferred Embodiment 1 and a frequency characteristic of the elastic-wave filter device of Comparative Example 1. FIG. 5 is an enlarged view of region A in FIG. 4. FIG. 6 is an enlarged view of region B in FIG. 4.

As is apparent from FIG. 4 and FIG. 5, insertion loss at higher frequencies in the pass band is smaller in the elastic-wave filter device 1 of Preferred Embodiment 1 satisfying the relationships f1<f2 and z1>z2 than that in the elastic-wave filter device of Comparative Example 1 satisfying the relationships f1<f2 and z1<z2. In the elastic-wave filter device 1 of Preferred Embodiment 1, where the impedance value z1 of the first parallel-arm resonator P1 having a resonance frequency closer to the pass band is large, the insertion loss at higher frequencies in the pass band is small. In the elastic-wave filter device of Comparative Example 1, where the impedance value z1 of the first parallel-arm resonator P1 having a resonance frequency closer to the pass band is small, the insertion loss at higher frequencies in the pass band is large. The level of steepness in the region of transition from the pass band to the attenuation band is higher in the elastic-wave filter device 1 of Preferred Embodiment 1 satisfying the relationships f1<f2 and z1>z2 than that in the elastic-wave filter device of Comparative Example 1 satisfying the relationships f1<f2 and z1<z2.

As is apparent from FIG. 4 and FIG. 6, attenuation in the stop band at frequencies higher than the pass band is larger in the elastic-wave filter device 1 of Preferred Embodiment 1 satisfying the relationships f1<f2 and z1>z2 than that in the elastic-wave filter device of Comparative Example 1 satisfying the relationships f1 <f2 and z1<z2. In the elastic-wave filter device 1 of Preferred Embodiment 1, where the impedance value z2 of the second parallel-arm resonator P2 having a resonance frequency farther from the pass band is small, the attenuation in the stop band is large. In the elastic-wave filter device of Comparative Example 1, where the impedance value z2 of the second parallel-arm resonator P2 having a resonance frequency farther from the pass band is large, the attenuation in the stop band is small.

Figure 7:
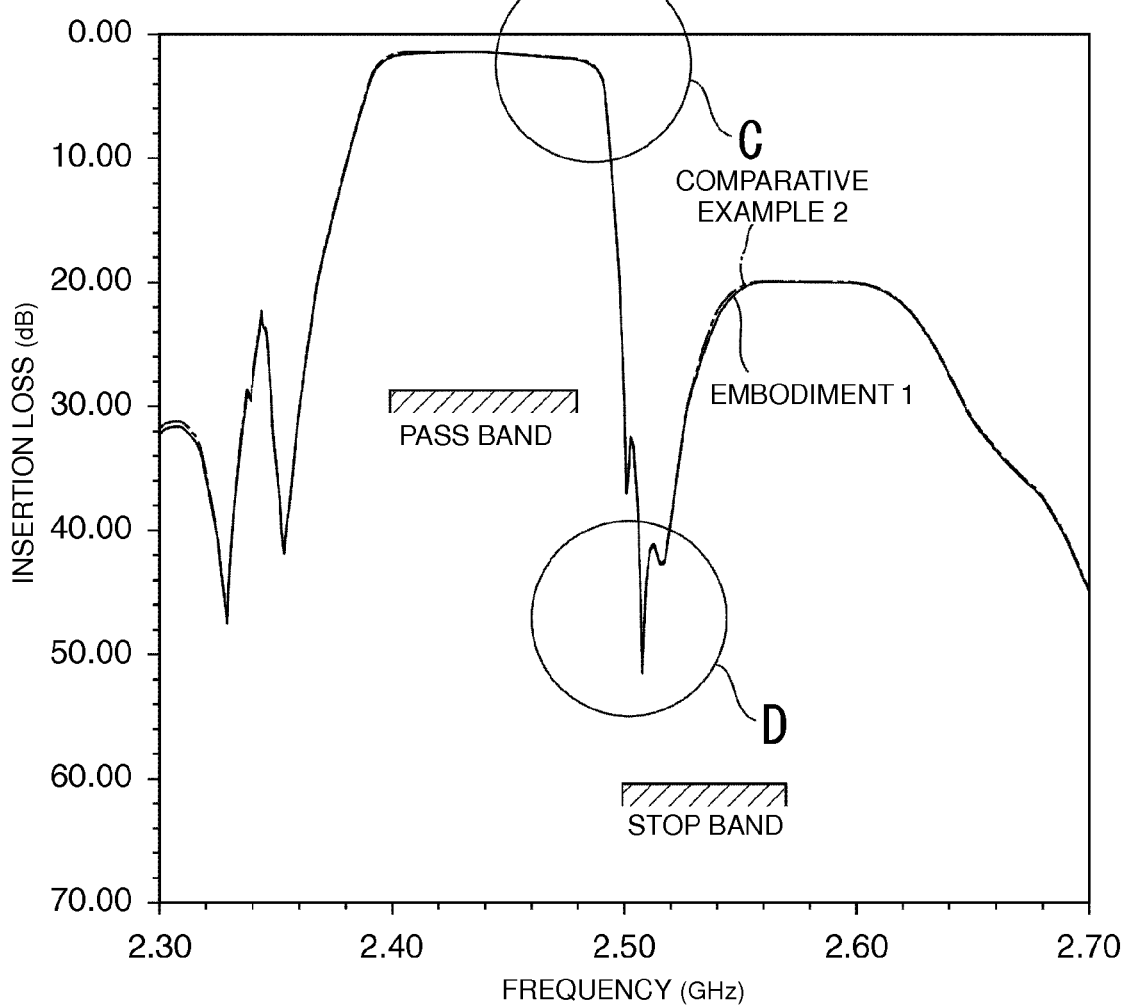
FIG. 7 is a graph showing a frequency characteristic of an elastic-wave filter device according to the first preferred embodiment and a frequency characteristic of an elastic-wave filter device according to Comparative Example 2.
Figure 8:
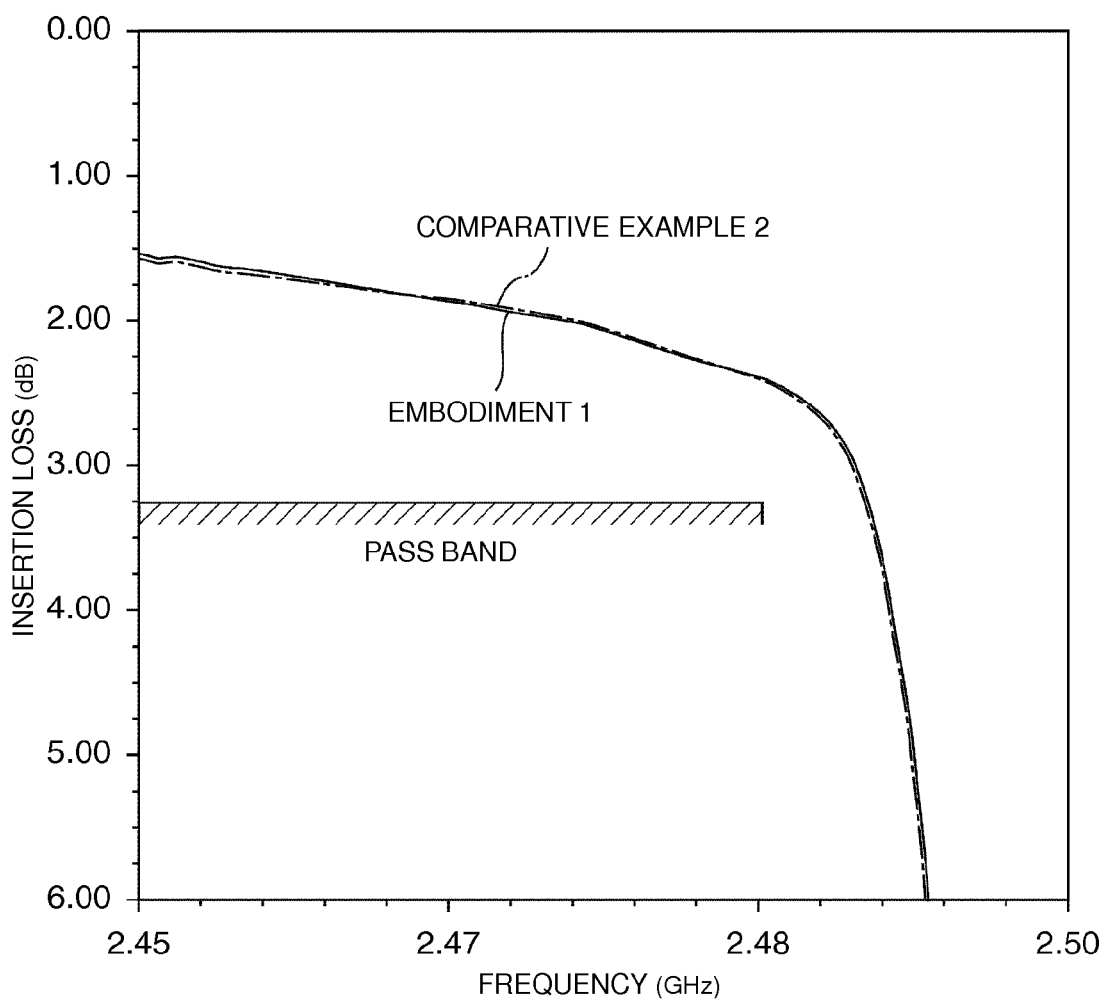
FIG. 8 is a graph showing an enlarged view of region C in FIG. 7.
Figure 9:
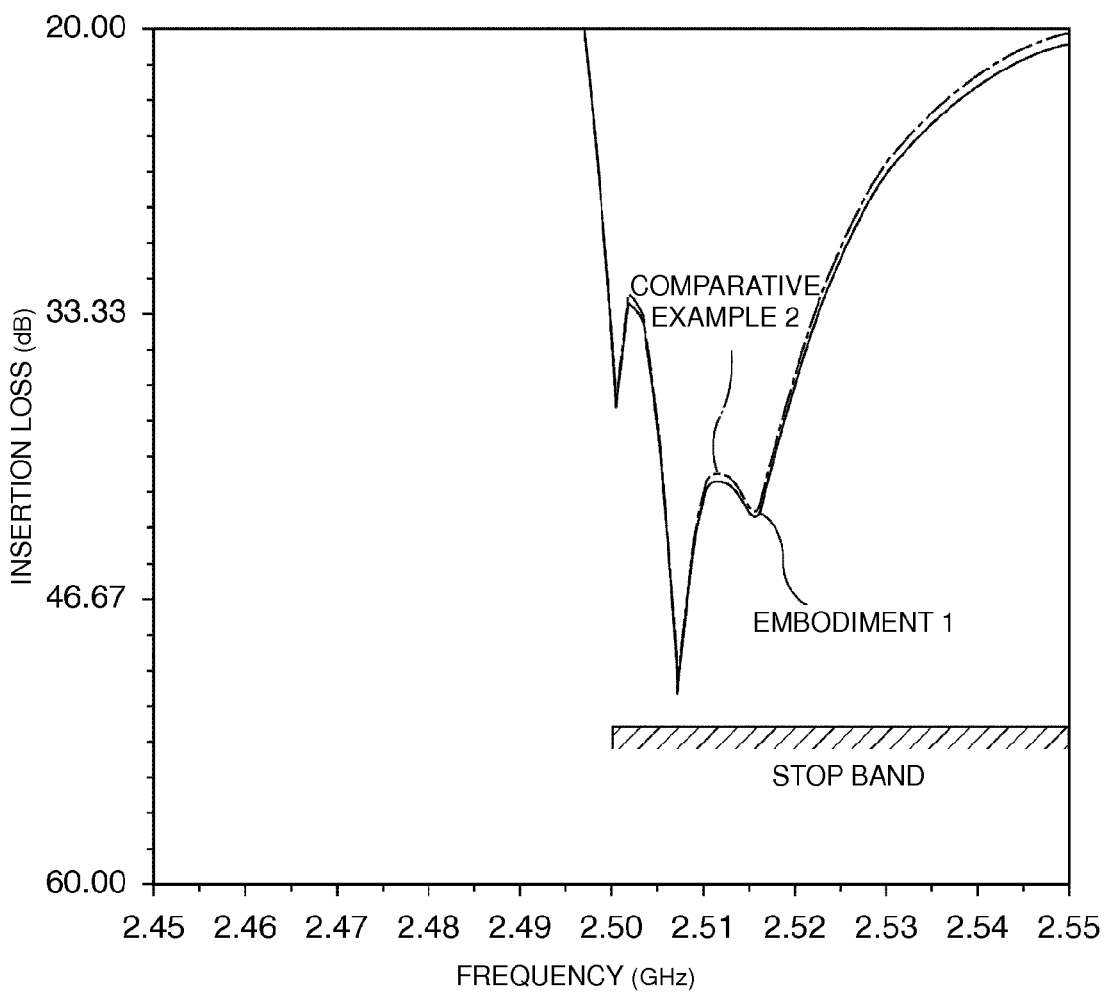
FIG. 9 is a graph showing an enlarged view of region D in FIG. 7.

FIG. 7 to FIG. 9 show a frequency characteristic of the elastic-wave filter device 1 of Preferred Embodiment 1 and a frequency characteristic of the elastic-wave filter device of Comparative Example 2. FIG. 8 is an enlarged view of region C in FIG. 7. FIG. 9 is an enlarged view of region D in FIG. 7.

As is apparent from FIG. 7 and FIG. 8, insertion loss at higher frequencies in the pass band of the elastic-wave filter device 1 of Preferred Embodiment 1 satisfying the relationships f1<f2 and z1>z2 is substantially the same as that in the elastic-wave filter device of Comparative Example 2 satisfying the relationships f1<f2 and z1=z2. In the elastic-wave filter device 1 of Preferred Embodiment 1, where the impedance value z1 of the first parallel-arm resonator P1 having a resonance frequency closer to the pass band is large, the insertion loss at higher frequencies in the pass band is small. In the elastic-wave filter device of Comparative Example 2, where the impedance value z1 of the first parallel-arm resonator P1 having a resonance frequency closer to the pass band is also large, the insertion loss at higher frequencies in the pass band is small. Also, the level of steepness in the region of transition from the pass band to the attenuation band in the elastic-wave filter device 1 of Preferred Embodiment 1 satisfying the relationships f1<f2 and z1>z2 is substantially the same as that in the elastic-wave filter device of Comparative Example 2 satisfying the relationships f1<f2 and z1=z2.

As is apparent from FIG. 7 and FIG. 9, attenuation in the stop band at frequencies higher than the pass band is larger in the elastic-wave filter device 1 of Preferred Embodiment 1 satisfying the relationships f1<f2 and z1>z2 than that in the elastic-wave filter device of Comparative Example 2 satisfying the relationships f1<f2 and z1=z2. In the elastic-wave filter device 1 of Preferred Embodiment 1, where the impedance value z2 of the second parallel-arm resonator P2 having a resonance frequency farther from the pass band is small, the attenuation in the stop band is large. In the elastic-wave filter device of Comparative Example 2, where the impedance value z2 of the second parallel-arm resonator P2 having a resonance frequency farther from the pass band is large, the attenuation in the stop band is small.

The results described above show that by making the impedance value z1 of the first parallel-arm resonator P1 having a lower resonance frequency larger than the impedance value z2 of the second parallel-arm resonator P2 having a higher resonance frequency, in other words, by making the impedance value z1 of the first parallel-arm resonator P1 having a resonance frequency closer to the pass band larger than the impedance value z2 of the second parallel-arm resonator P2 having a resonance frequency farther from the pass band, it is possible to significantly reduce insertion loss at higher frequencies in the pass band, significantly increase the level of steepness in the region of transition from the pass band to the attenuation band, and significantly increase attenuation in the stop band at frequencies higher than the pass band.

Other preferred embodiments of the present invention will now be described. Note that components having substantially the same functions as those of the first embodiment are referred to by the same reference numerals and their description will be omitted.

Second Preferred Embodiment

Figure 10:
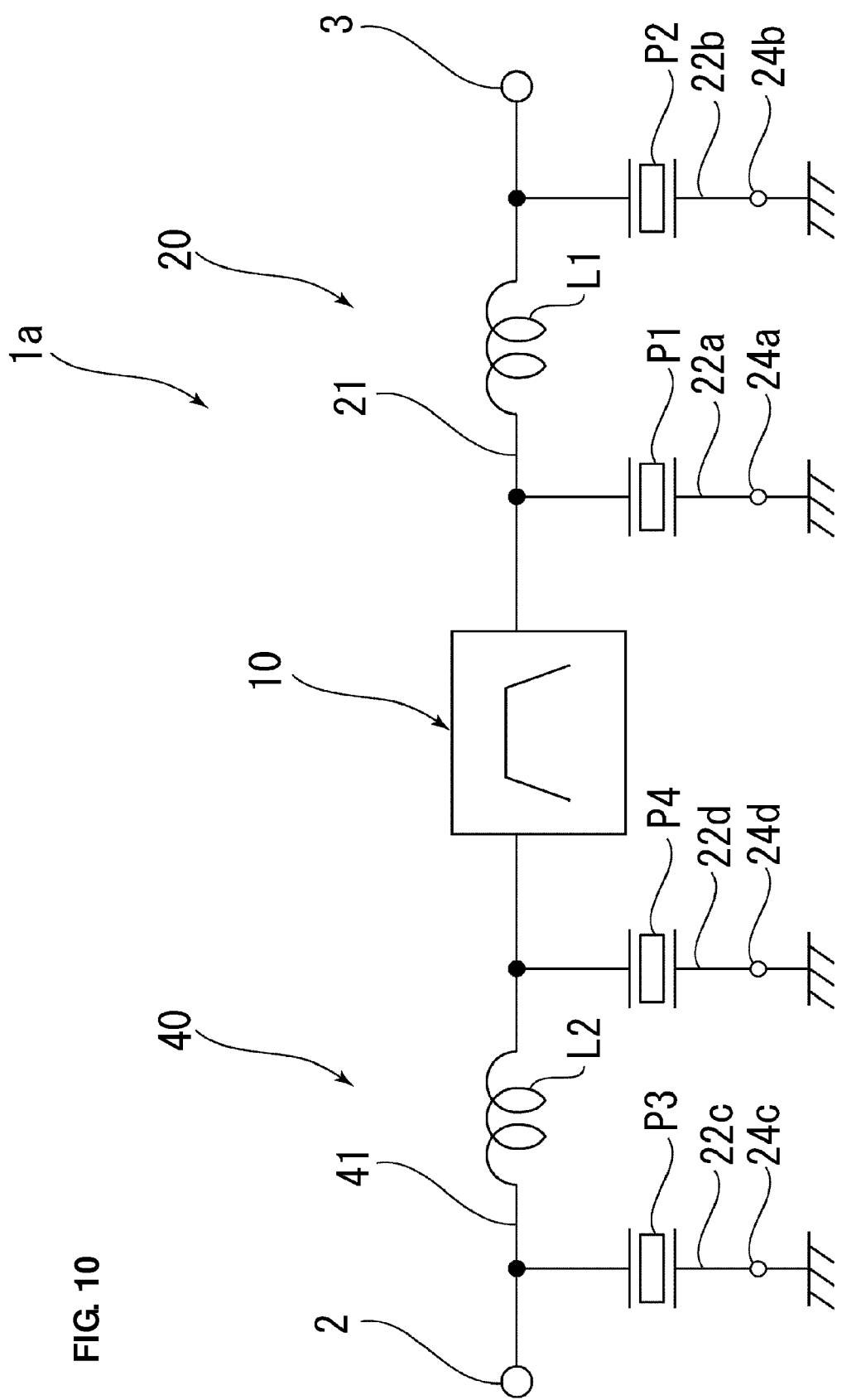
FIG. 10 is an equivalent circuit diagram of an elastic-wave filter device according to a second preferred embodiment of the present invention.

FIG. 10 is an equivalent circuit diagram of an elastic-wave filter device 1a according to a second preferred embodiment of the present invention.

As illustrated in FIG. 10, the elastic-wave filter device 1a of the present preferred embodiment is different from the elastic-wave filter device 1 of the first preferred embodiment in that it includes a second band-eliminate filter 40, which will now be described in detail. As for the other elements, the description of the first preferred embodiment will be incorporated herein. As in the first preferred embodiment, FIG. 2 and FIG. 3 will be referenced in the present preferred embodiment.

In the elastic-wave filter device 1a of the present preferred embodiment, the second band-eliminate filter 40 is connected between the input terminal 2 and the band-pass filter 10. This means that the band-pass filter 10 is connected between the first band-eliminate filter 20 and the second band-eliminate filter 40. In other words, between the input terminal 2 and the output terminal 3, the first band-eliminate filter 20 is connected in series to one end of the band-pass filter 10, and the second band-eliminate filter 40 is connected in series to the other end of the band-pass filter 10. Like the elastic-wave filter device 1 of the first preferred embodiment, the elastic-wave filter device 1a has a pass band and a stop band at frequencies higher than the pass band. The pass band is defined mainly by the band-pass filter 10. The stop band is defined mainly by the first band-eliminate filter 20 and the second band-eliminate filter 40.

The second band-eliminate filter 40 preferably has substantially the same configuration as that of the first band-eliminate filter 20. Specifically, as illustrated in FIG. 10, the second band-eliminate filter 40 preferably is a ladder filter. The second band-eliminate filter 40 includes a series arm 41 connected in series between the input terminal 2 and the output terminal 3. Specifically, the series arm 41 is connected between the input terminal 2 and the terminal 10a illustrated in FIG. 2. The series arm 41 includes at least one inductor L2. Specifically, the series arm 41 includes one inductor L2 in the present preferred embodiment. Alternatively, the series arm 41 may include a plurality of inductors. In this case, the plurality of inductors are connected in series in the series arm 41.

A plurality of parallel arms 22c and 22d are connected between the series arm 41 and the ground potential. Specifically, in the present preferred embodiment, two parallel arms 22c and 22d are connected between the series arm 41 and the ground potential. The parallel arm 22c is connected between a connection point between the input terminal 2 and the inductor L2 and the ground potential. The parallel arm 22d is connected between a connection point between the inductor L2 and the band-pass filter 10 and the ground potential.

The parallel arm 22c includes a third parallel-arm resonator P3. The parallel arm 22d includes a fourth parallel-arm resonator P4. In the present preferred embodiment, like the first and second parallel-arm resonators P1 and P2, the third parallel-arm resonator P3 and the fourth parallel-arm resonator P4 preferably are surface acoustic wave resonators. The third and fourth parallel-arm resonators P3 and P4 are also provided on the piezoelectric substrate 31 illustrated in FIG. 3. However, the third and fourth parallel-arm resonators P3 and P4 do not have to be surface acoustic wave resonators. The third and fourth parallel-arm resonators P3 and P4 may be boundary acoustic wave resonators or bulk wave resonators, for example.

The parallel arm 22c includes a ground electrode 24c connected to the ground potential. The parallel arm 22d includes a ground electrode 24d connected to the ground potential. The parallel arms 22c and 22d are individually connected to the ground potential by the ground electrodes 24c and 24d respectively. In other words, the third and fourth parallel-arm resonators P3 and P4 are individually connected to the ground potential by the ground electrodes 24c and 24d, respectively. In the present preferred embodiment where the ground electrodes 24a to 24d are separated from one another, the parallel arms 22a to 22d are individually connected to the ground potential by the ground electrodes 24a to 24d, respectively. In other words, the first to fourth parallel-arm resonators P1 to P4 are individually connected to the ground potential by the ground electrodes 24a to 2d, respectively. Like the ground electrodes 24a and 24b, the ground electrodes 24c and 24d are provided on the mount board 33.

Like the inductor L1 and the matching inductors L3 and L4, the inductor L2 is defined by a wire on the piezoelectric substrate 31, a wire on the mount board 33, or a chip inductor. If the inductor L2 is defined by a chip inductor, the chip inductor is mounted either on the mount board 33 or on a circuit board on which the mount board 33 is mounted.

The third parallel-arm resonator P3 has a resonance frequency f3. The fourth parallel-arm resonator P4 has a resonance frequency f4. The resonance frequency f3 of the third parallel-arm resonator P3 and the resonance frequency f4 of the fourth parallel-arm resonator P4 are in the stop band. The resonance frequency f4 of the fourth parallel-arm resonator P4 is higher than the resonance frequency f3 of the third parallel-arm resonator P3.

An impedance value of the third parallel-arm resonator P3 is denoted by z3, and an impedance value of the fourth parallel-arm resonator P4 is denoted by z4. The impedance value z3 of the third parallel-arm resonator P3 is larger than the impedance value z4 of the fourth parallel-arm resonator P4. That is, the impedance value z3 of the third parallel-arm resonator P3 having a lower resonance frequency is larger than the impedance value z4 of the fourth parallel-arm resonator P4 having a higher resonance frequency. In other words, the impedance value z3 of the third parallel-arm resonator P3 having a resonance frequency closer to the pass band is larger than the impedance value z4 of the fourth parallel-arm resonator P4 having a resonance frequency farther from the pass band. Specifically, the impedance value z3 at the resonance frequency f3 of the third parallel-arm resonator P3 is larger than the impedance value z4 at the resonance frequency f4 of the fourth parallel-arm resonator P4.

By providing a plurality of band-eliminate filters as in the present preferred embodiment, it is possible to significantly increase attenuation in the stop band. By making resonance frequencies of two or more of a plurality of parallel-arm resonators equal, for example, by making the resonance frequency f1 of the first parallel-arm resonator P1 equal to the resonance frequency f3 of the third parallel-arm resonator P3 or by making the resonance frequency f2 of the second parallel-arm resonator P2 equal to the resonance frequency f4 of the fourth parallel-arm resonator P4, it is possible to significantly increase attenuation in the stop band.

Also, by providing a plurality of band-eliminate filters as in the present preferred embodiment, it is possible to widen the stop band. For example, by making the resonance frequency f1 of the first parallel-arm resonator P1, the resonance frequency f2 of the second parallel-arm resonator P2, the resonance frequency f3 of the third parallel-arm resonator P3, and the resonance frequency f4 of the fourth parallel-arm resonator P4 all different, it is possible to widen the stop band.

In the present preferred embodiment, it is preferable that a resonance frequency of at least one of the first to fourth parallel-arm resonators P1 to P4 be different from those of the other parallel-arm resonators, and that a parallel-arm resonator having a resonance frequency closer to the pass band have a larger impedance value. This makes it possible to significantly reduce insertion loss at higher frequencies in the pass band, significantly increase the level of steepness in the region of transition from the pass band to the attenuation band, and significantly increase attenuation in the stop band at frequencies higher than the pass band.

Like the first band-eliminate filter 20, the second band-eliminate filter 40 may be disposed between the band-pass filter 10 and the output terminal 3. In this case, however, it is preferred that a matching inductor be connected in series between the first band-eliminate filter 20 and the second band-eliminate filter 40. This increases the size of the elastic-wave filter device.

In the present preferred embodiment, however, the band-pass filter 10 is preferably connected between the first band-eliminate filter 20 and the second band-eliminate filter 40.

In this case, the band-pass filter 10 serves also as a matching circuit. Therefore, it is not necessary to add the matching inductor described above. The size of the elastic-wave filter device can thus be significantly reduced.

Third to Fifth Preferred Embodiments

Figure 11:
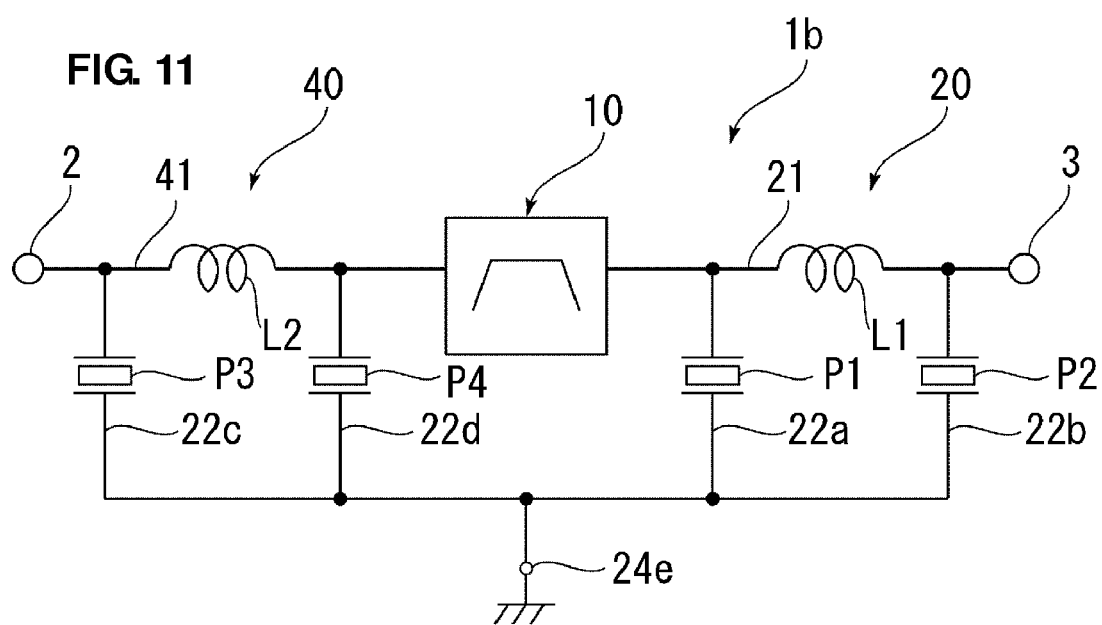
FIG. 11 is an equivalent circuit diagram of an elastic-wave filter device according to a third preferred embodiment of the present invention.
Figure 12:
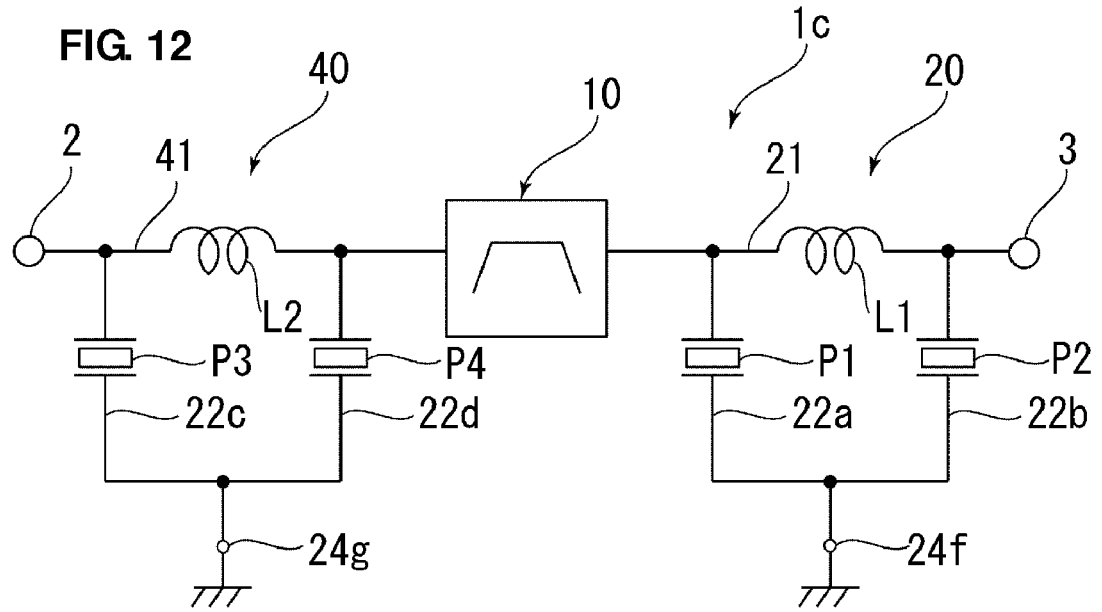
FIG. 12 is an equivalent circuit diagram of an elastic-wave filter device according to a fourth preferred embodiment of the present invention.
Figure 13:
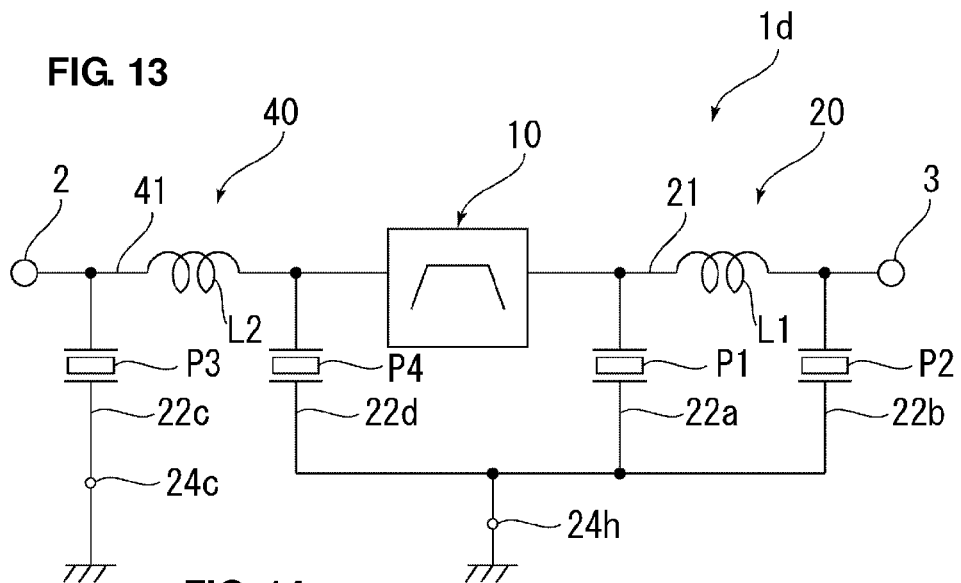
FIG. 13 is an equivalent circuit diagram of an elastic-wave filter device according to a fifth preferred embodiment of the present invention.

FIG. 11 is an equivalent circuit diagram of an elastic-wave filter device 1b according to a third preferred embodiment of the present invention. FIG. 12 is an equivalent circuit diagram of an elastic-wave filter device 1c according to a fourth preferred embodiment of the present invention. FIG. 13 is an equivalent circuit diagram of an elastic-wave filter device 1d according to a fifth preferred embodiment of the present invention.

The elastic-wave filter devices 1b to 1d illustrated in FIG. 11 to FIG. 13 are different from the elastic-wave filter device 1a of the second preferred embodiment only in terms of the configurations of ground electrodes placed in the parallel arms 22a to 22d. The description will be given only of the configurations of ground electrodes placed in the parallel arms 22a to 22d according to the third to fifth preferred embodiments. As for the other elements, the description of the first and second preferred embodiments will be incorporated herein.

As illustrated in FIG. 11, in the elastic-wave filter device 1b of the third preferred embodiment, all the parallel arms 22a to 22d are combined and connected to the ground potential by a ground electrode 24e. In other words, the first to fourth parallel-arm resonators P1 to P4 are combined and connected to the ground potential by the ground electrode 24e. The ground electrode 24e is located on the mount board 33. Therefore, in the elastic-wave filter device 1b, the parallel arms 22a to 22d are connected together on the mount board 33.

As illustrated in FIG. 12, in the elastic-wave filter device 1c of the fourth preferred embodiment, the parallel arms 22a and 22b of the first band-eliminate filter 20 are combined and connected to the ground potential by a ground electrode 24f, and the parallel arms 22c and 22d of the second band-eliminate filter 40 are combined and connected to the ground potential by a ground electrode 24g separated from the ground electrode 24f. In other words, the first and second parallel-arm resonators P1 and P2 of the first band-eliminate filter 20 are combined and connected to the ground potential by the ground electrode 24f, and the third and fourth parallel-arm resonators P3 and P4 of the second band-eliminate filter 40 are combined and connected to the ground potential by the ground electrode 24g separated from the ground electrode 24f. The ground electrodes 24f and 24g are located on the mount board 33. Therefore, in the elastic-wave filter device 1c, the parallel arms 22a and 22b are connected together on the mount board 33, and the parallel arms 22c and 22d are connected together on the mount board 33.

As illustrated in FIG. 13, in the elastic-wave filter device 1d of the fifth preferred embodiment, the parallel arm 22c of the second band-eliminate filter 40 is connected to the ground potential by the ground electrode 24c, and the remaining parallel arms 22a, 22b, and 22d are combined and connected to the ground potential by a ground electrode 24h separated from the ground electrode 24c. In other words, the third parallel-arm resonator P3 of the second band-eliminate filter 40 is connected to the ground potential by the ground electrode 24c, and the first and second parallel-arm resonators P1 and P2 of the first band-eliminate filter 20 and the fourth parallel-arm resonator P4 of the second band-eliminate filter 40 are combined and connected to the ground potential by the ground electrode 24h separated from the ground electrode 24c. The ground electrodes 24c and 24h are located on the mount board 33. Therefore, in the elastic-wave filter device 1d, the parallel arms 22a, 22b, and 22d are connected together on the mount board 33.

Although a plurality of parallel arms are connected together on the mount board 33 in the elastic-wave filter devices 1b to 1d, the plurality of parallel arms may be connected together on the piezoelectric substrate 31.

Figure 14:
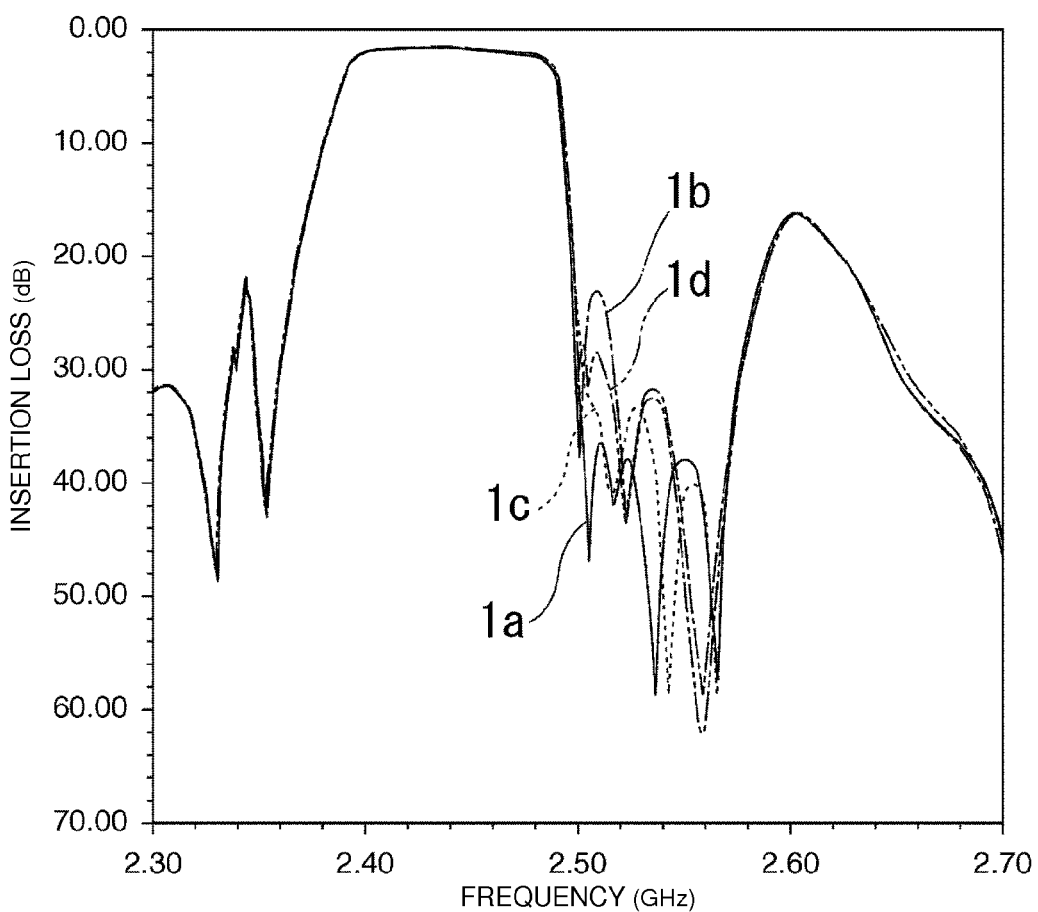
FIG. 14 is a graph showing frequency characteristics of the elastic-wave filter devices according to the second to fifth preferred embodiments of the present invention.
Figure 15:
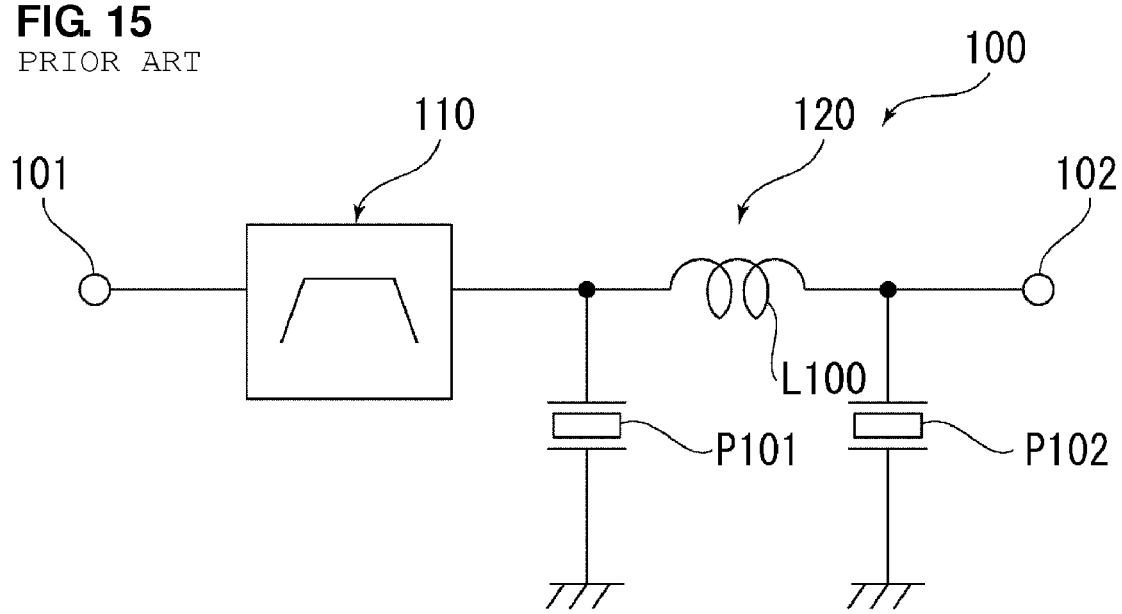
FIG. 15 is an equivalent circuit diagram of an elastic-wave filter device that includes an elastic-wave band-eliminate filter and an elastic-wave band-pass filter.

FIG. 14 shows frequency characteristics of the elastic-wave filter devices according to the second to fifth preferred embodiments. In FIG. 14, a solid line indicates a frequency characteristic of the elastic-wave filter device 1a of the second preferred embodiment, a dotted-chain line indicates a frequency characteristic of the elastic-wave filter device 1b of the third preferred embodiment, a dotted line indicates a frequency characteristic of the elastic-wave filter device 1c of the fourth preferred embodiment, and a double-dotted chain line indicates a frequency characteristic of the elastic-wave filter device 1d of the fifth preferred embodiment.

In the second to fifth preferred embodiments, the pass band preferably ranges from 2.40 GHz to 2.48 GHz and the stop band ranges from 2.50 GHz to 2.57 GHz, for example. The stop band is at frequencies higher than the pass band. The resonance frequency f1 of the first parallel-arm resonator P1 preferably is 2.50 GHz, for example. The resonance frequency f2 of the second parallel-arm resonator P2 preferably is 2.507 GHz, for example. The resonance frequency f3 of the third parallel-arm resonator P3 preferably is 2.54 GHz, for example. The resonance frequency f4 of the fourth parallel-arm resonator P4 preferably is 2.57 GHz, for example. The resonance frequencies f1 to f4 of the first to fourth parallel-arm resonators P1 to P4 are in the stop band. The impedance value z1 of the first parallel-arm resonator P1, the impedance value z2 of the second parallel-arm resonator P2, the impedance value z3 of the third parallel-arm resonator P3, and the impedance value z4 of the fourth parallel-arm resonator P4 have the relationship $z1>z2>z3>z4$. An inductance value of the inductor L1 preferably is about 3 nH, for example. An inductance value of the inductor L2 preferably is about 3 nH, for example.

As described above, in the second to fifth preferred embodiments, the first to fourth parallel-arm resonators P1 to P4 are configured to satisfy the relationships $f1<f2<f3<f4$ and $z1>z2>z3>z4$. In the first to fourth parallel-arm resonators P1 to P4, the impedance value z1 of the first parallel-arm resonator P1 having the lowest resonance frequency is larger than the impedance values z2 to z4 of the second to fourth parallel-arm resonators P2 to P4. That is, the impedance value z1 of the first parallel-arm resonator P1 having a resonance frequency closest to the pass band is larger than the impedance values z2 to z4 of the second to fourth parallel-arm resonators P2 to P4 having resonance frequencies farther from the pass band.

As is apparent from FIG. 14, attenuation in the stop band is larger in the elastic-wave filter devices 1a, 1c, and 1d having configurations where at least one of the parallel arms 22a to 22d is connected to the ground potential by a ground electrode different from that of the other parallel arms, than that in the elastic-wave filter device 1b having a configuration where the parallel arms 22a to 22d are combined and connected to the ground potential by the ground electrode 24e. This result shows that by connecting at least one of a plurality of parallel arms to a ground electrode separated from that to which the other parallel arms are connected, it is possible to significantly increase attenuation in the stop band.

Specifically, attenuation in the stop band is larger in the elastic-wave filter device 1c than that in the elastic-wave filter device 1d. Also, attenuation in the stop band is larger in the elastic-wave filter device 1a than that in the elastic-wave filter device 1c. This result shows that it is preferable that, of a plurality of parallel arms, a smaller number of parallel arms be combined and connected to the ground potential by a ground electrode, and it is more preferable that all the plurality of parallel arms be individually connected to the ground potential by different ground electrodes.

Modifications of Preferred Embodiments

In the first preferred embodiment, a description has been given of an example where the stop band is at frequencies higher than the pass band, the first band-eliminate filter 20 includes the first parallel-arm resonator P1 having the resonance frequency f1 and the impedance value z1 and the second parallel-arm resonator P2 having the resonance frequency f2 and the impedance value z2, the resonance frequency f1 of the first parallel-arm resonator P1 and the resonance frequency f2 of the second parallel-arm resonator P2 are in the stop band, and the relationships $f1<f2$ and $z1>z2$ are preferably satisfied, for example. However, the present invention is not limited to this configuration. For example, the stop band may be at frequencies lower than the pass band and the relationships $f1<f2$ and $z1<z2$ may be satisfied where the first band-eliminate filter 20 includes the first parallel-arm resonator P1 having the resonance frequency f1 and the impedance value z1 and the second parallel-arm resonator P2 having the resonance frequency f2 and the impedance value z2, and the resonance frequency f1 of the first parallel-arm resonator P1 and the resonance frequency f2 of the second parallel-arm resonator P2 are in the stop band.

Also, in the second preferred embodiment, the stop band may be at frequencies lower than the pass band and the relationships $f1<f2$, $f3<f4$, $z1<z2$, and $z3<z4$ may be satisfied where the first band-eliminate filter 20 includes the first parallel-arm resonator P1 having the resonance frequency f1 and the impedance value z1 and the second parallel-arm resonator P2 having the resonance frequency f2 and the impedance value z2, the second band-eliminate filter 40 includes the third parallel-arm resonator P3 having the resonance frequency f3 and the impedance value z3 and the fourth parallel-arm resonator P4 having the resonance frequency f4 and the impedance value z4, and the resonance frequencies f1 to f4 of the first to fourth parallel-arm resonators P1 to P4 are in the stop band.

In other words, any configuration is possible in which, of a plurality of parallel-arm resonators, a parallel-arm resonator with a resonance frequency closer to the pass band has a larger impedance value.

Although the first and second band-eliminate filters 20 and 40 each are preferably configured to include two parallel arms, they each may be a ladder filter to include more than two steps or stages.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic-wave filter device having a pass band and a stop band at frequencies higher than the pass band, the elastic-wave filter device comprising:
   an input terminal;
   an output terminal;
   a band-pass filter connected in series between the input terminal and the output terminal; and
   a first band-eliminate filter connected in series between the input terminal and the output terminal; wherein
   the first band-eliminate filter includes a series arm connected in series between the input terminal and the output terminal, at least one inductor connected in series in the series arm, a plurality of parallel arms connected between the series arm and a ground potential, and a plurality of parallel-arm resonators in the respective plurality of parallel arms;
   the plurality of parallel-arm resonators include a first parallel-arm resonator having a first resonance frequency in the stop band and a second parallel-arm resonator having a second resonance frequency in the stop band, the second resonance frequency being higher than the first resonance frequency; and
   an impedance value of the first parallel-arm resonator is larger than an impedance value of the second parallel-arm resonator.

2. The elastic-wave filter device according to claim 1, wherein the first band-eliminate filter further includes a first ground electrode connected to the ground potential and to which the parallel arm including the first parallel-arm resonator is connected, and a second ground electrode connected to the ground potential and to which the parallel arm including the second parallel-arm resonator is connected, and the first ground electrode and the second ground electrode are separated from each other.

3. The elastic-wave filter device according to claim 1, further comprising a second band-eliminate filter connected in series between the input terminal and the output terminal, wherein the second band-eliminate filter includes a series arm connected in series between the input terminal and the output terminal, at least one inductor connected in series in the series arm, a plurality of parallel arms connected between the series arm and the ground potential, and a plurality of parallel-arm resonators in the respective plurality of parallel arms.

4. The elastic-wave filter device according to claim 3, wherein between the input terminal and the output terminal, the first band-eliminate filter is connected in series to one end of the band-pass filter, and the second band-eliminate filter is connected in series to the other end of the band-pass filter.

5. The elastic-wave filter device according to claim 3, wherein the plurality of parallel-arm resonators of the first band-eliminate filter and the plurality of parallel-arm resonators of the second band-eliminate filter have different resonance frequencies.

6. The elastic-wave filter device according to claim 3, wherein, of the plurality of parallel-arm resonators of the first band-eliminate filter and the plurality of parallel-arm resonators of the second band-eliminate filter, two or more parallel-arm resonators have the same resonance frequency.

7. An elastic-wave filter device having a pass band and a stop band at frequencies lower than the pass band, the elastic-wave filter device comprising:
   an input terminal;
   an output terminal;
   a band-pass filter connected in series between the input terminal and the output terminal; and
   a first band-eliminate filter connected in series between the input terminal and the output terminal; wherein
   the first band-eliminate filter includes a series arm connected in series between the input terminal and the output terminal, at least one inductor connected in series in the series arm, a plurality of parallel arms connected between the series arm and a ground potential, and a plurality of parallel-arm resonators in the respective plurality of parallel arms;
   the plurality of parallel-arm resonators include a first parallel-arm resonator having a first resonance frequency in the stop band and a second parallel-arm resonator having a second resonance frequency in the stop band, the second resonance frequency being higher than the first resonance frequency; and
   an impedance value of the second parallel-arm resonator is larger than an impedance value of the first parallel-arm resonator.

* * * * *